(12) United States Patent
Tamamizu et al.

(10) Patent No.: US 11,961,686 B2
(45) Date of Patent: Apr. 16, 2024

(54) IRREVERSIBLE SWITCH FOR LAMINATED COMMUNICATION DEVICE, AND LAMINATED COMMUNICATION DEVICE USING THE SWITCH

(71) Applicant: KANDA KOGYO CO., LTD., Himeji (JP)

(72) Inventors: Haruki Tamamizu, Himeji (JP); Takashi Nakano, Himeji (JP); Tadayoshi Kikuchi, Himeji (JP); Misaki Doi, Himeji (JP)

(73) Assignee: Kanda Kogyo Co., Ltd., Himeji (JP)

( * ) Notice: Subject to any disclaimer, the term of this patent is extended or adjusted under 35 U.S.C. 154(b) by 228 days.

(21) Appl. No.: 17/602,799

(22) PCT Filed: Apr. 17, 2020

(86) PCT No.: PCT/JP2020/018209
§ 371 (c)(1),
(2) Date: Oct. 11, 2021

(87) PCT Pub. No.: WO2020/241166
PCT Pub. Date: Dec. 3, 2020

(65) Prior Publication Data
US 2022/0157538 A1 May 19, 2022

(30) Foreign Application Priority Data
May 27, 2019 (JP) ................. 2019-098217

(51) Int. Cl.
*H01H 13/12* (2006.01)
*H05K 1/18* (2006.01)

(52) U.S. Cl.
CPC ....... *H01H 13/12* (2013.01); *H01H 2209/002* (2013.01); *H01H 2227/032* (2013.01);
(Continued)

(58) Field of Classification Search
CPC ...... H01H 3/125; H01H 13/705; H01H 13/14; H01H 13/04; H01H 13/10; H01H 13/70;
(Continued)

(56) References Cited

U.S. PATENT DOCUMENTS

2014/0340208 A1* 11/2014 Tan .................. G06F 3/016
340/407.2

FOREIGN PATENT DOCUMENTS

| JP | 2001-126587 A | 5/2001 |
| JP | 2003-077368 A | 3/2003 |

(Continued)

OTHER PUBLICATIONS

International Search Report / Written Opinion dated Aug. 11, 2020 for PCT/JP2020/018209 (with English translation of the International Search Report).

*Primary Examiner* — Ahmed M Saeed
(74) *Attorney, Agent, or Firm* — Faegre Drinker Biddle & Reath LLP

(57) ABSTRACT

An irreversible power switch which is operational from the outside after lamination of laminated communication device and the like, includes a substrate, electrodes disposed on the substrate, a brittle member disposed so as to face the electrodes and apart from the electrodes and a conductive adhesive portion disposed on the brittle member at a side to face the electrodes thereof. The electrodes and the conductive adhesive portion are irreversibly and electrically bonded by brittle fracture of the brittle member under the external pressing force in the thickness direction of the laminated communication device.

12 Claims, 12 Drawing Sheets

(52) U.S. Cl.
CPC ..... *H05K 1/18* (2013.01); *H05K 2201/10037* (2013.01); *H05K 2201/10053* (2013.01)

(58) Field of Classification Search
CPC ............. H01H 13/704; H01H 13/7065; H01H 13/7006; H01H 13/7057; H01H 13/78; H01H 13/79; H01H 13/52; H01H 13/703; H01H 13/507; H01H 3/12; H01H 13/20
See application file for complete search history.

(56) References Cited

FOREIGN PATENT DOCUMENTS

| | | |
|---|---|---|
| JP | 2010-129383 A | 6/2010 |
| JP | 2010-238376 A | 10/2010 |
| JP | 2011-171267 A | 9/2011 |

\* cited by examiner

Fig. 8
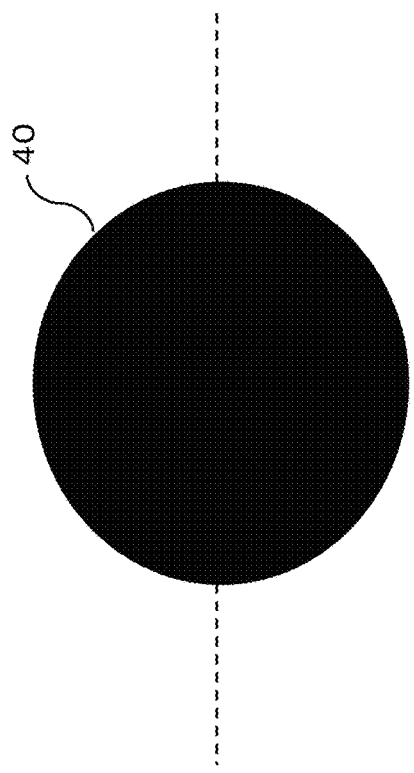
(a) View from top
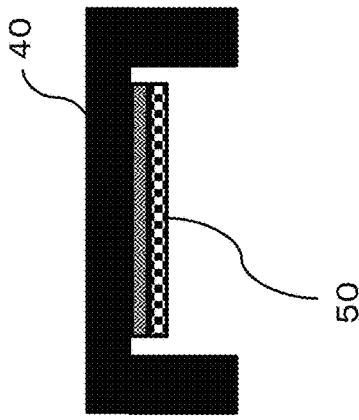
(b) Cross Section (Dotted line)

Fig. 9
40
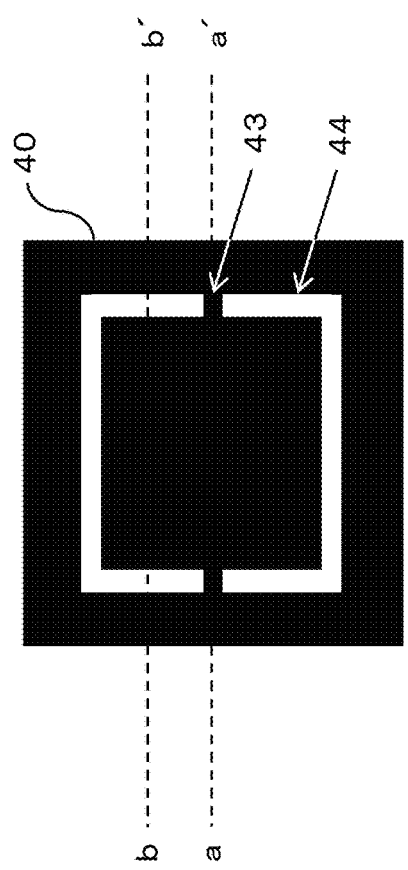
(a) View from top
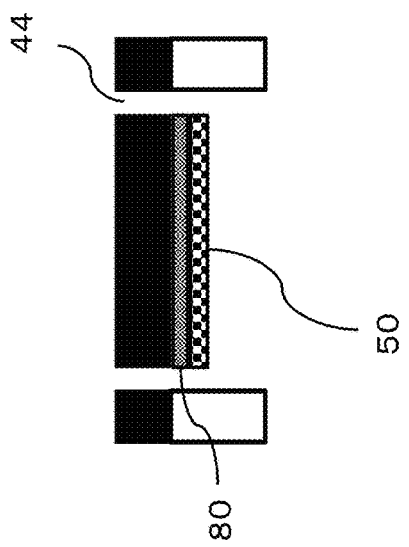
(c) Cross Section (b–b´)
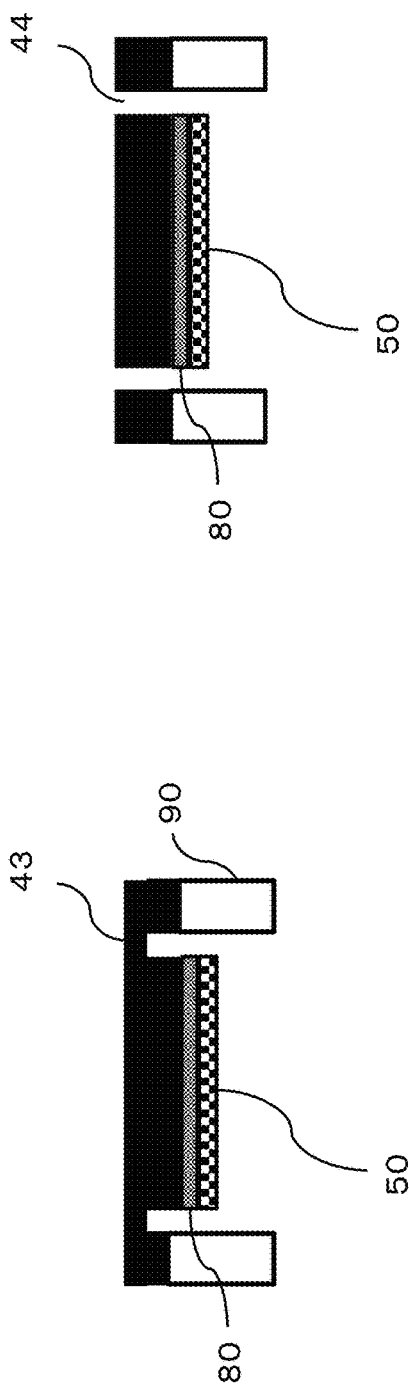
(b) Cross Section (a–a´)

Fig. 10
40
(a) View from top
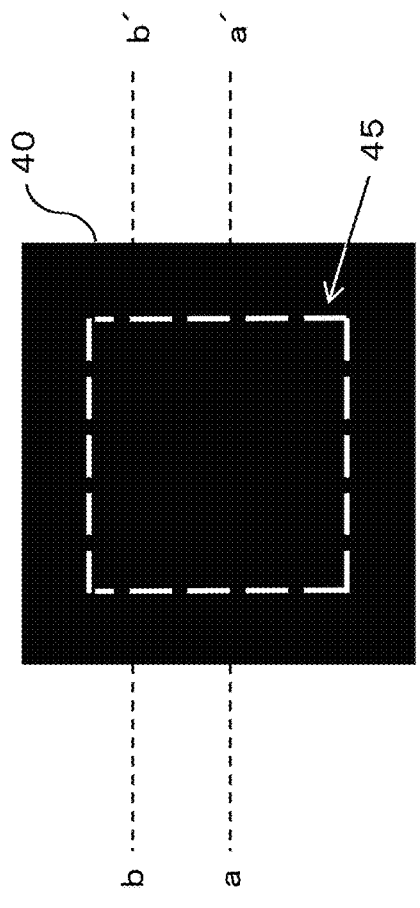
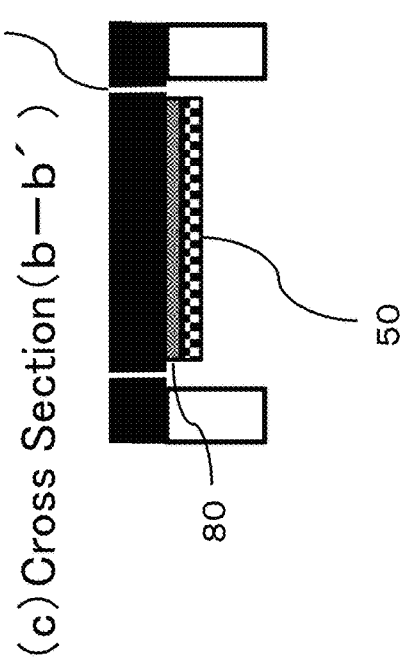
(c) Cross Section (b-b')
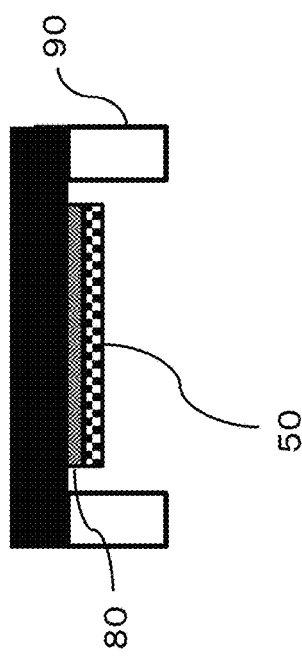
(b) Cross Section (a-a')

Fig. 11
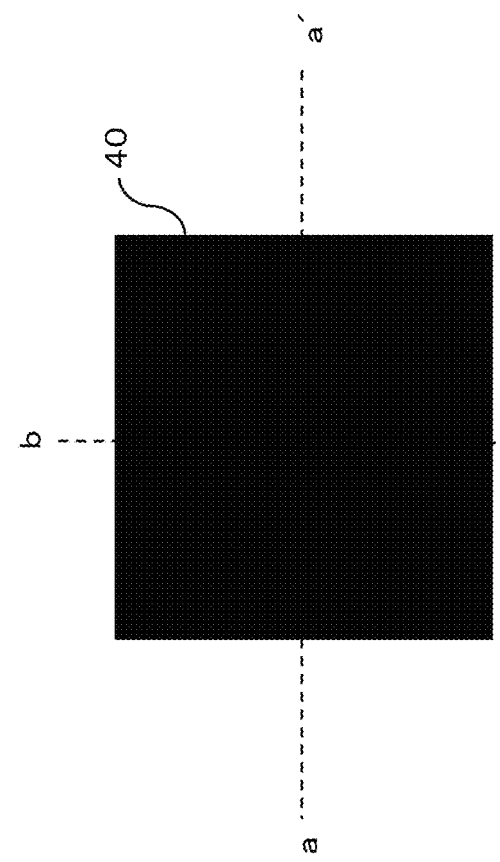
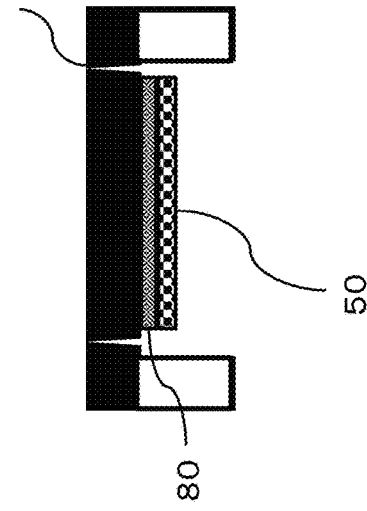
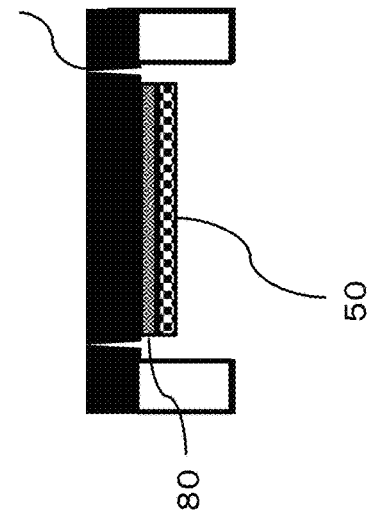

IRREVERSIBLE SWITCH FOR LAMINATED COMMUNICATION DEVICE, AND LAMINATED COMMUNICATION DEVICE USING THE SWITCH

TECHNICAL FIELD

The present invention particularly relates to an irreversible switch suitable for a laminated communication device. The invention further relates to a laminated communication device using such a switch.

BACKGROUND ART

In recent years, communication devices have been required to be thinner to facilitate mounting onto films or cards.

As a power source of the communication devices, coin batteries have been widely used. The coin battery commonly includes an insulation sheet, which is inserted along with the coin battery not to energize the device in shipping and is removed to energize the device when first used.

However, the laminated communication devices are laminated with such a power source held inside, and are unable to adapt the above structure.

As such, a conventional laminated communication device has been in contact electrically with its power source from the time of shipment, such that a leakage current is structurally inevitable.

Consequently, it has been difficult to predict battery consumption of the laminated communication device during the time from manufacture to storage, the time of shipment, and the time until a user's first use after purchase. Thus, warranty on battery lifetime or prolonging the service of products have been issues.

On the other hand, reversible switches, which may be used for laminated communication devices, are known as a conventional technology.

For example, following patent literatures (PLT) 1-3 disclose sheet switches (or membrane switches). See, for example, FIGS. 1 and 2 of PLT 1.

PRIOR ART

Patent Literature

[PLT 1] Japanese Unexamined Patent Application Publication No. 2011-171267
[PLT 2] Japanese Unexamined Patent Application Publication No. 2010-129383
[PLT 3] Japanese Unexamined Patent Application Publication No. 2010-238376

SUMMARY OF INVENTION

Technical Problem

However, a switch under the conventional technology turns on only when being pressed, which is a reversible switch. Such structure can protect the switch from energizing during shipping, while it fails to energize the switch constantly after the start of its use without any external operation, such as pressing.

The conventional technology is unsuitable, in particular, for communication devices, which need to be energized all the time once they start being used.

In addition, the switch under the conventional technology uses an elastic metal dome. The elastic metal dome, as adopted for such laminated communication devices, easily creates a ridge on the device surface, and this impairs the beauty of its appearance.

To solve the above problems, this invention provides an irreversible power switch which can be operated to energize from the outside of the laminated communication device.

Solution to Problem

In an embodiment of the present invention, a switch (1) for a laminated communication device includes a substrate, electrodes disposed on the substrate, a brittle member disposed so as to face the electrodes and apart from the electrodes, and a conductive adhesive portion disposed on the brittle member at a side to face the electrodes thereof.

The switch (1) for the laminated communication device according to aspects of the present invention further includes a metal wiring or a metal film that is disposed between the brittle member and the conductive adhesive portion therein.

The switch (1) for the laminated communication device according to aspects of the present invention further includes a distance between the electrodes and the conductive adhesive portion that is from 0.05 to 0.1 mm.

The switch (1) for the laminated communication device according to aspects of the present invention further includes the electrodes and the conductive adhesive portion that are irreversibly and electrically bonded by brittle fracture of the brittle member under an external pressing force in the thickness direction of the laminated communication device.

The switch (1) for the laminated communication device according to aspects of the present invention further includes the electrodes and the conductive adhesive portion and the metal wiring or the metal film that are irreversibly and electrically bonded by brittle fracture of the brittle member under the external pressing force in the thickness direction of the laminated communication device.

In another embodiment of the present invention, a switch (2) for a laminated communication device includes a substrate, electrodes disposed on the substrate, a brittle member disposed so as to face the electrodes and apart from the electrodes, a conductive adhesive portion disposed on the electrodes, and a metal wiring or a metal film disposed on the brittle member at a side of the electrodes thereof.

The switch (2) for the laminated communication device according to aspects of the present invention further includes a distance between the metal wiring or the metal film and the conductive adhesive portion that is from 0.05 to 0.1 mm.

The switch (2) for the laminated communication device according to aspects of the present invention further includes the electrodes and the conductive adhesive portion and the metal wiring or the metal film that are irreversibly and electrically bonded by brittle fracture of the brittle member under an external pressing force in the thickness direction of the laminated communication device.

The switch (1) and (2) for the laminated communication device according to aspects of the present invention further includes the brittle member that is made of ceramic.

The switch (1) and (2) for the laminated communication device according to aspects of the present invention further includes the brittle member that has at least either one of cut-out, through hole, groove and notch in a thickness direction so as to easily cause brittle fracture under an external pressing force in the thickness direction of the laminated communication device.

The switch (1) and (2) for the laminated communication device according to aspects of the present invention further includes the conductive adhesive portion that is a conductive adhesive sheet.

In the embodiments of the present invention, the switch (1) and (2) for the laminated communication device further include a pressing member of the conductive adhesive portion that is disposed on a laminated film surface at an opposite side of the substrate.

The laminated communication device according to aspects of the present invention includes the switch (1) or the switch (2) for the laminated communication device.

The laminated communication device according to aspects of the present invention further includes both the switch (1) or the switch (2) for the laminated communication device, and a reversible push switch.

Advantageous Effects of Invention

Thus, the switch for the laminated communication device according to aspects of the present invention, which is non-energized at the time of its lamination, can be energized irreversibly under the subsequent external pressing force. Additionally, the switch for the laminated communication device according to the embodiments of the present invention, using no elastic metal dome in the structure, includes no perceptible ridge on the device surface which is derived from the elastic metal dome.

BRIEF DESCRIPTION OF DRAWINGS

FIGS. 8A and 8B are diagrams of an example (2) of the brittle member 40 according to a second embodiment of the present invention.

FIGS. 9A, 9B and 9C are diagrams of an example (3) of the brittle member 40 according to a third embodiment of the present invention.

FIGS. 10A, 10B and 10C are diagrams of an example (4) of the brittle member 40 according to a fourth embodiment of the present invention.

FIGS. 11A, 11B and 11C are diagrams of an example (5) of the brittle member 40 according to a fifth embodiment of the present invention.

DESCRIPTION OF EMBODIMENTS

The followings provide detailed descriptions with diagrams about the embodiments of the present invention. The descriptions, which are the embodiments of the present invention, do not limit the contents described in the Claims. In all diagrams, same components have the same marks, and the descriptions are omitted as appropriate.

<Laminated Communication Device>

A laminated communication device 100, including the switch 1 for a laminated communication device in the overall structure, according to an embodiment of the present invention is described with reference to FIG. 1.

Figure 1:
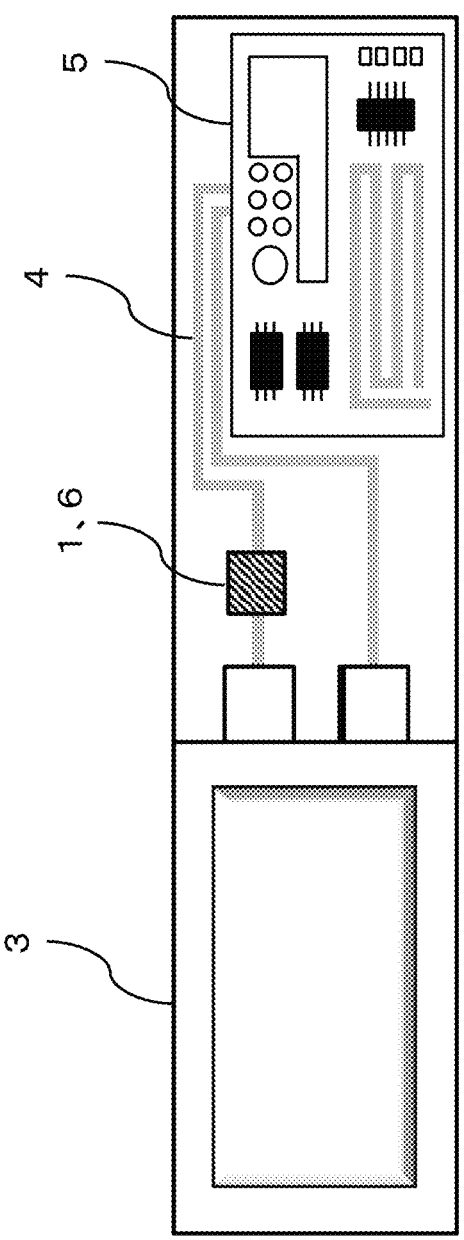
FIG. 1 is a diagram illustrating the overall structure of the laminated communication device (1) including a switch 1 for the laminated communication device according to an embodiment of the present invention.

FIG. 1 is a diagram illustrating the laminated communication device 100 before its lamination. The laminated communication device 100 interiorly includes an integrated circuit 5, a film battery 3, and a metal wiring 4 which electrically connects the integrated circuit 5 and the film battery 3. The switch 1 for the laminated communication device is disposed along the metal wiring 4. In other words, the first part of the metal wiring 4 connects to the second part of the metal wiring 4 through the switch 1 for the laminated communication device. The laminated communication device 100 is manufactured by laminating the whole of such communication device. A position of the switch 1 for the communication device can be designed not only along the metal wiring 4, but also on other positions, such as an appropriate point interior of the integrated circuit 5, accordingly.

Disposing the switch 1 for the laminated communication device enables the laminated communication device 100, which is non-energized at the time of shipment, to be energized by pressing the switch at the start of its use. The switch 1 for the laminated communication device, which is an irreversible switch, keeps it energized once a user presses the switch to energize, and cannot be turned off as described below.

The laminated communication device 100 includes communication functions, such as beacon signals using, for example, Bluetooth (or Near Field Communication), Low Power Wide Area (LPWA) and Wi-Fi. The communication functions are not limited to the above examples and also include the ones using light or ultrasound.

The laminated communication device 100 may have other functions such as GPS or accelerometer as required.

The laminated communication device 100 could be the same size as a credit card according to International Standard ISO/IEC7810, and could be other appropriate size such as vertically long shape. Its thickness may be 2.54 mm or under, and preferably 0.76 mm or under, but is not limited to these values. The embodiments may be hard enough to maintain its planar shape independently, and some embodiments may be a flexible film.

Varieties of lamination according to the embodiments of the present invention include not only methods of process with sticking more than one different materials and laminating them, but also methods of process to be as thin as with laminating such as dipping or molding, which are not commonly called "lamination."

Figure 2:
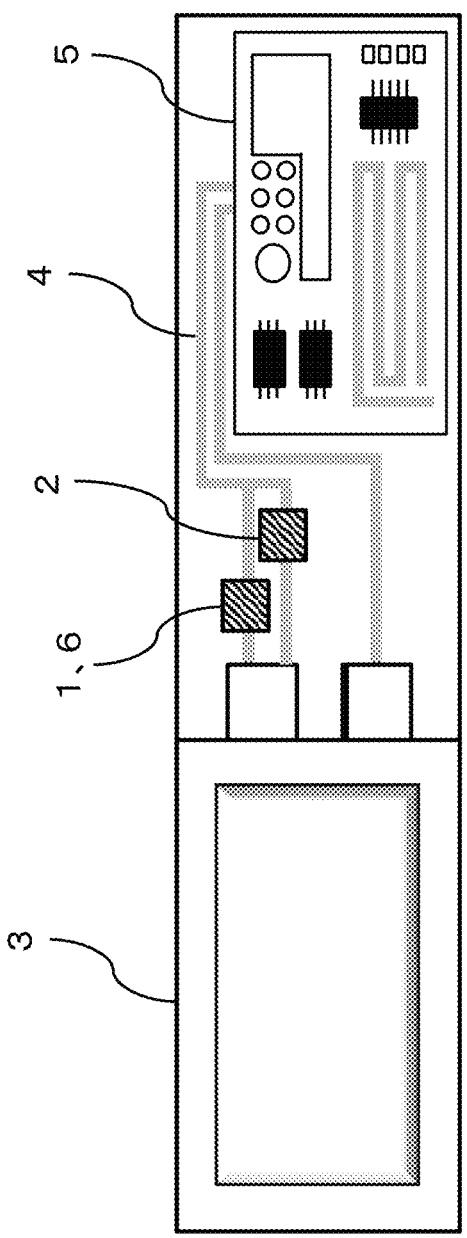
FIG. 2 is a diagram illustrating the overall structure of the laminated communication device (2) including the switch 2 for the laminated communication device according to an embodiment of the present invention.

FIG. 2 is a diagram illustrating another embodiment of the laminated communication device 100 which includes a reversible push switch 2 disposed in parallel to the switch 1 for the laminated communication device. In the example of the diagram, the metal wiring 4 bifurcates, and the switch 1 for the laminated communication devices is disposed on one bifurcation, while the reversible push switch 2 on another. Some embodiments may include a wiring in parallel to the metal wiring 4 other than the metal wiring 4, and the push switch 2 is disposed on this parallel wiring.

Prior to shipment of the laminated communication device 100, the devices need to be energized temporarily in order to check whether those can properly work or not. Unfortunately, the switch 1 for the laminated communication device cannot be energized at the working check as it is an irreversible switch as mentioned above.

Then, by disposing the reversible push switch 2 in parallel to the switch 1 for the laminated communication device, it is possible to perform a working check by letting it temporarily energized. In other words, the reversible push switch 2 can be turned off after the check.

Such reversible push switch 2 may include the known switches, such as a sheet switch using an elastic dome switch.

<Switch 1 for Laminated Communication Device>

Figure 3:
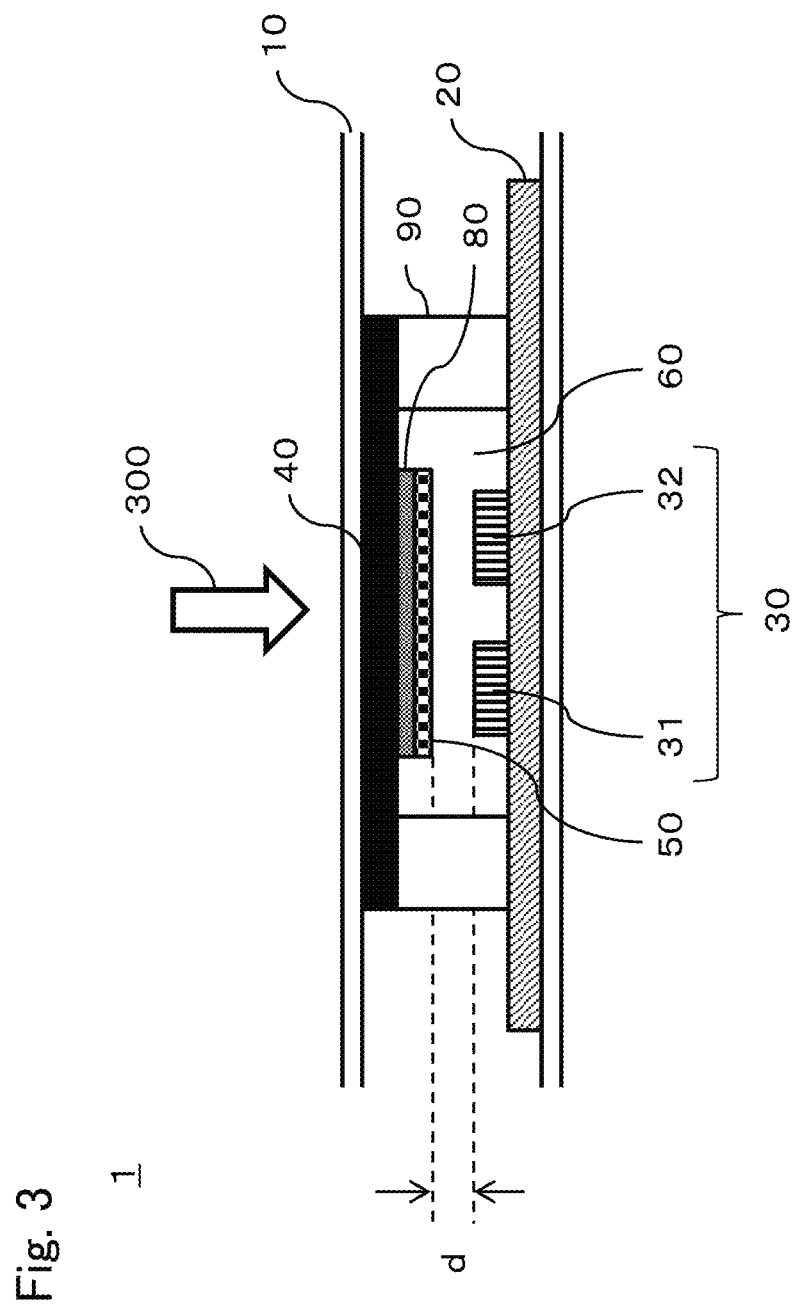
FIG. 3 is a vertical cross-sectional view illustrating the switch (1) for the laminated communication device before pressed according to an embodiment of the present invention.

FIG. 3 is a vertical cross-sectional view illustrating the switch 1 for the laminated communication device before pressed according to an embodiment of the present invention.

The switch 1 for the laminated communication device includes electrodes 30 disposed on a substrate 20 and a brittle member 40 disposed apart from the electrodes 30, so as to secure a space 60, and a conductive adhesive portion 50 disposed on the brittle member 40 at a side to face the electrodes 30. A spacer 90 secures the space 60.

The substrate 20 may include, without limitation, the known ones, such as printed circuit board. Varieties of the printed circuit board may include, without limitation, rigid board and flexible printed circuit. A base film of the flexible printed circuit may be made of, for example, polyimide, polyethylene-terephthalate (PET) or polyethylene-naphthalate (PEN).

An electrode A 31 and an electrode B 32 included in the electrodes 30, are disposed electrically apart from each other. In the example of the diagram, the electrode A 31 and the electrode B 32 are disposed flush with the substrate 20 and physically apart from each other. The electrodes 30 and the conductive adhesive portion 50 are disposed electrically apart from each other by the brittle member 40. A distance between the electrodes 30 and the conductive adhesive portion 50 is preferably from 0.05 to 0.1 mm. The distance may be adjusted by changing the height of the space 90.

The brittle member 40 and the conductive adhesive portion 50 are disposed to cover both the electrode A 31 and the electrode B 32. The conductive adhesive portion 50 is only required to adhere to the both electrodes and to cause them to be connected electrically, and may include the known conductive adhesives. The conductive adhesive portion 50 may be preferably conductive adhesive sheets.

The metal wiring or the metal film 80 may be disposed between the brittle member 40 and the conductive adhesive portion 50. Disposing the metal wiring or the metal film 80 provides a better conductivity after pressing the switch, as mentioned below.

Figure 4:
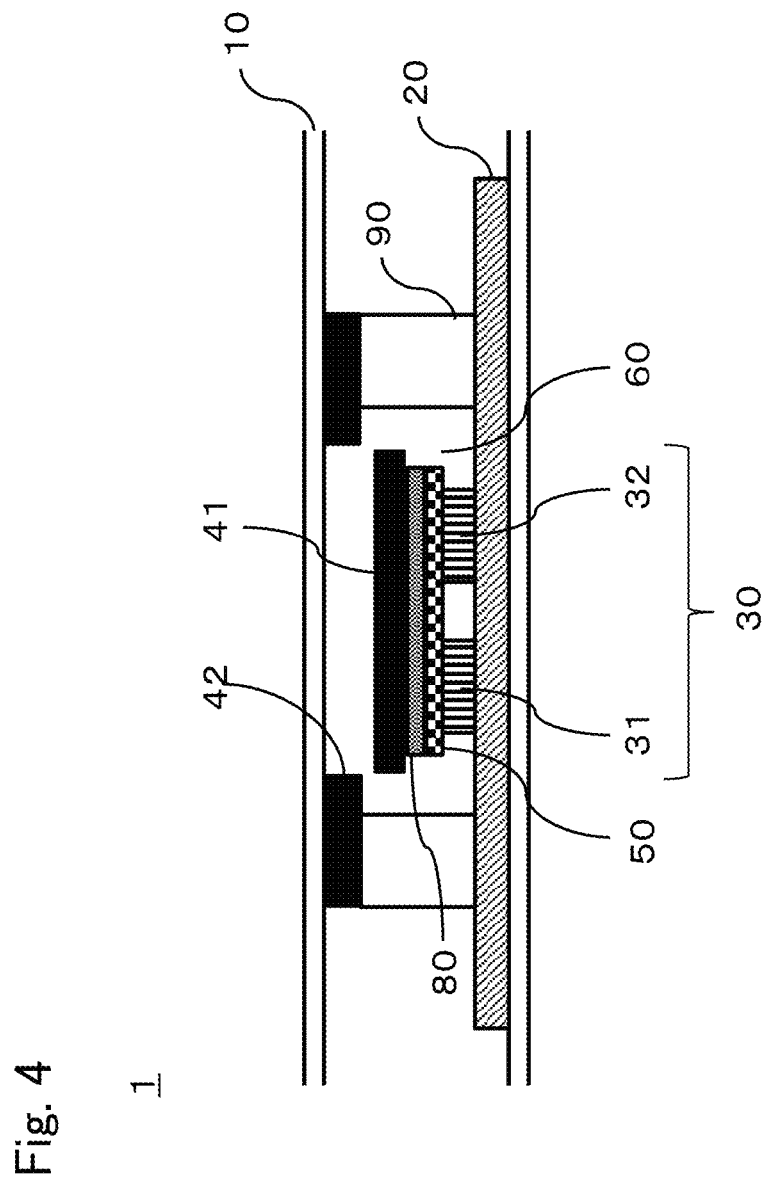
FIG. 4 is a vertical cross-sectional view illustrating the switch (1) for the laminated communication device after pressed according to an embodiment of the present invention.

The switch 1 for the laminated communication device turns on under an enough external pressing force 300 in a thickness direction of the laminated communication device as illustrated in FIGS. 3 and 4. Such mechanism is described below.

FIG. 4 is a vertical cross-sectional view illustrating the switch 1 for the laminated communication device after pressed according to an embodiment of the present invention.

Brittle fracture of a part of the brittle member 40 under the external pressing force 300 causes the conductive adhesive portion 50 to adhere to the electrodes 30, and then the conductive adhesive portion 50 maintains an electrical conduction at least in the area where the electrode A 31 and the electrode B 32 overlap. This causes the electrode A 31 and the electrode B 32, which are electrically apart from each other at first, to be connected electrically, and then the switch 1 for the laminated communication device turns on.

In case where the metal wiring or the metal film 80 is disposed between the brittle member 40 and the conductive adhesive portion 50, the external pressing force 300 causes brittle fracture of a part of the brittle member 40 together with the metal wiring or the metal film 80 and the conductive adhesive portion 50, and then the metal wiring or the metal film 80 and the conductive adhesive portion 50 adhere to the electrodes 30. This causes the electrode A 31 and the electrode B 32, which are electrically apart from each other at first, to be connected electrically, and then the switch 1 for the laminated communication device turns on.

The conductive adhesive portion 50, which is conductive, causes the electrode A 31 and the electrode B 32 to be connected electrically without the metal wiring or the metal film 80. However, the conductive adhesive portion 50 may fail to have enough conductivity in planar direction. Disposing the metal wiring or the metal film 80 may enhance its conductivity and achieve higher electrical bond between the electrode A 31 and the electrode B 32.

The brittle member 40 after brittle fracture will never reverse and the conductive adhesive portion 50 keeps adhering to the metal wiring or the metal film 80 and the electrodes 30. This enables the switch 1 for the laminated communication device to keep it energized and then an irreversible switch is achieved.

The switch for the laminated communication device according to an embodiment of the present invention, using no elastic metal dome, includes no perceptive ridge on the device surface which is derived from the elastic metal dome, and then may avoid impairing the beauty of its appearance.

<Switch 6 for Laminated Communication Device>

Figure 5:
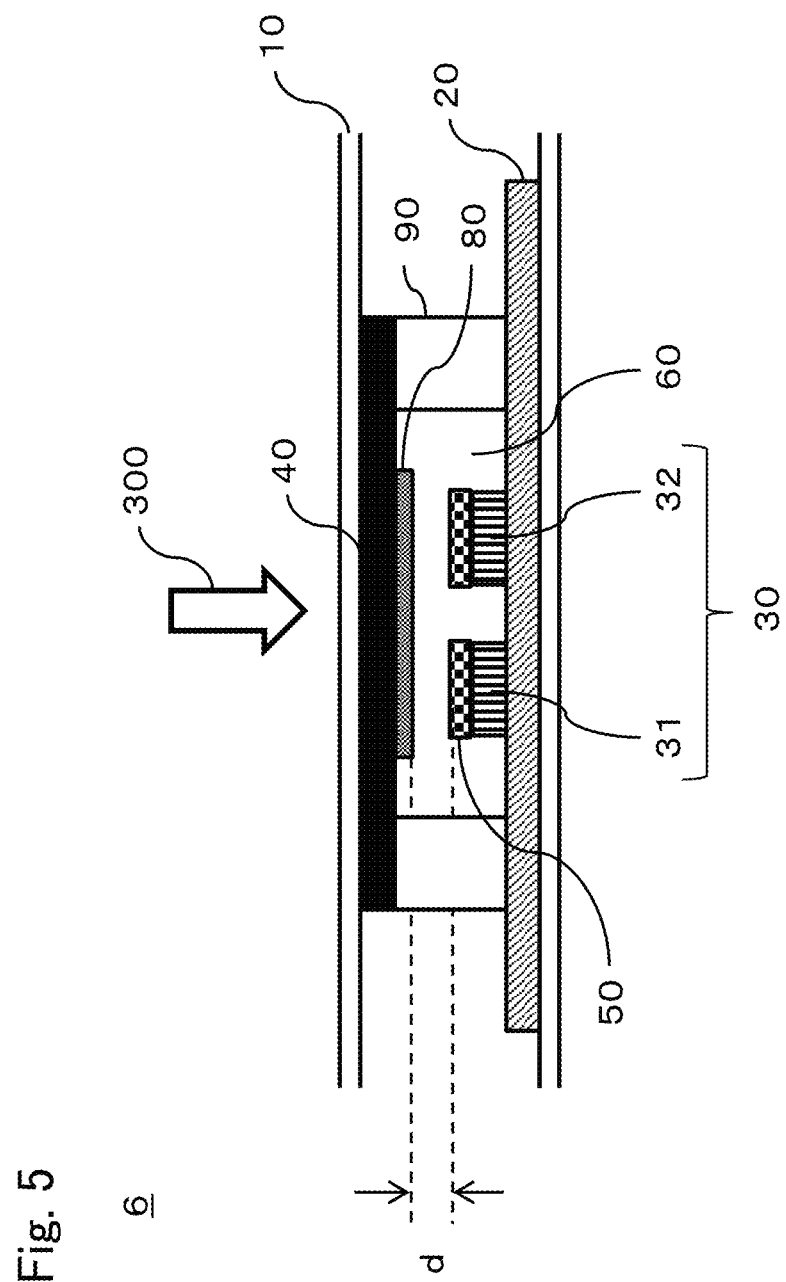
FIG. 5 is a vertical cross-sectional view illustrating the switch (2) for the laminated communication device before pressed according to an embodiment of the present invention.

FIG. 5 is a vertical cross-sectional view illustrating the switch 6 for the laminated communication device before pressed according to an embodiment of the present invention.

The switch 6 for the laminated communication device includes the electrodes 30 disposed on the substrate 20, the conductive adhesive portion 50 disposed on the electrodes 30, the brittle member 40 disposed apart from the electrodes 30 so as to secure the space 60, and the metal wiring or the metal film 80 disposed on the brittle member 40 at a side of the electrodes.

Such switch differs from the switch 1 in that the conductive adhesive portion 50 is disposed on the electrodes 30, and the metal wiring or the metal film 80 is disposed on the brittle member 40.

Figure 6:
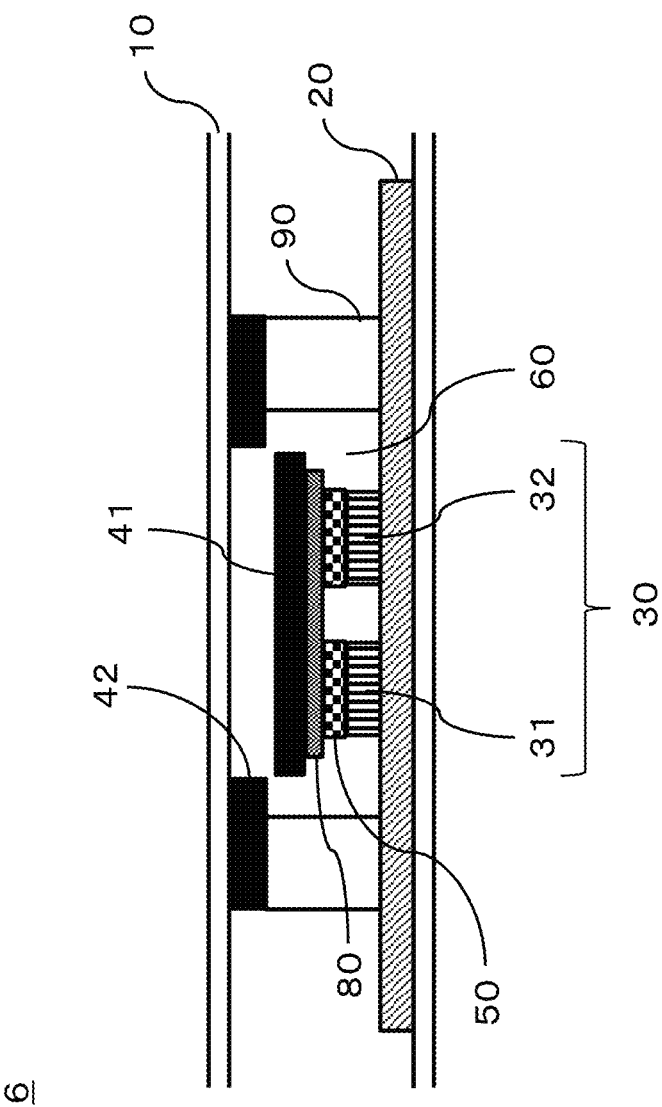
FIG. 6 is a vertical cross-sectional view illustrating the switch (2) for the laminated communication device after pressed according to an embodiment of the present invention.
Figure 7:
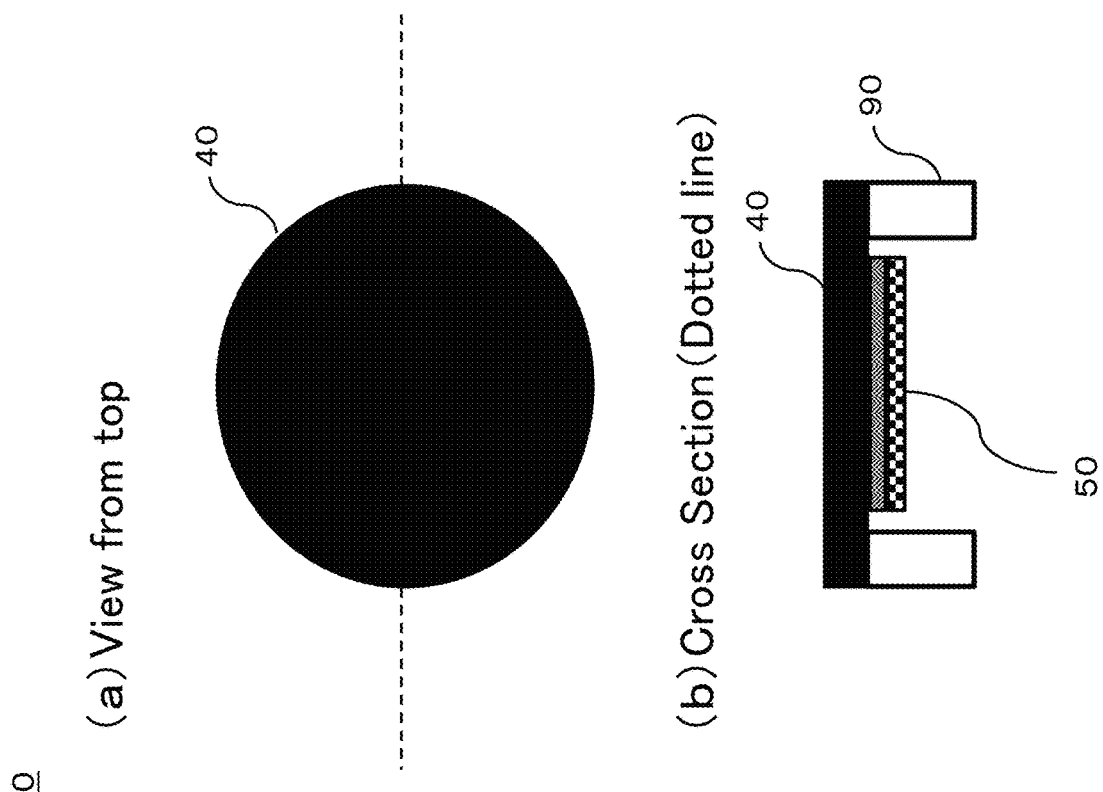
FIGS. 7A and 7B are diagrams of an example (1) of the brittle member 40 according to a first embodiment of the present invention.

FIG. 6 is a vertical cross-sectional view illustrating the switch 6 for the laminated communication device after pressed according to another embodiment of the present invention. Brittle fracture of the brittle member 40 causes the electrode A 31 and the electrode B 32 to be connected electrically and then the switch 6 for the laminated communication device turns on.

<Brittle Member 40>

The brittle member 40 may be, for example, plate or sheeted member. The brittle member 40 is made of brittle materials, which may be any material causing brittle fracture (or fracture) under an external pressing force in the thickness direction of the switch 1 or 6 for the laminated communication device. Such brittle material may include the known ones, for example, ceramics, glass, silicon, and hard plastic. The brittle material is only required to have the above nature, and are not limited to those examples.

The brittle member 40 is intended to cause brittle fracture under as much force as a person's pressing with a finger. Too much brittleness causes unintentional brittle fracture with a little impact such as during shipment. On the other hand, requirement of tools for brittle fracture loses simplicity in switch operation, and further may damage other parts such as the substrate 20 due to mishandling. Both are undesirable.

The force that a person presses the switch for the laminated communication device with a finger (or the external pressing force 300) is approximately 10 newton (N). When the size of the switch is a 10 millimeters (mm) squire, the pressure exerted on the entire switch becomes approximately 100 kilopascal (kPa). The switch gathers such pressure exerted on the entire switch, and the pressure onto the brittle member 40 placed in the switch is estimated to be from tens to hundreds of times higher than that of the pressure on the entire switch.

The brittle member 40 may be conductive, for example, such as conductive ceramic. In that case, the brittle member 40 includes the function of the metal wiring or the metal film 80, and such brittle member 40 becomes a combined member of the brittle member 40 and the metal wiring or the metal film 80.

FIG. 7 to FIG. 11 are diagrams illustrating examples of the brittle member 40 according to the embodiments of the present invention.

FIG. 7A and FIG. 7B are diagrams illustrating an example 1 of the brittle member 40. The brittle member 40 forms simple disc shape, and is disposed on the spacer 90. The spacer 90 is intended not to be destroyed even under the external pressing force 300 which causes brittle fracture of the brittle member 40.

FIG. 8A and FIG. 8B are diagrams illustrating an example 2 of the brittle member 40. The brittle member 40 includes the spacer 90. This structure can omit a process of disposing the spacer 90.

The brittle member 40 includes either one of cut-out, thorough hole, groove and notch as required, so as to easily cause brittle fracture under an external pressing force in a thickness direction of the laminated communication device 1. Such structure may be formed through known methods including laser beam machining and molding. In case of using the brittle member 40 made of silicon, such structure can be formed through a process of Micro Electro Mechanical System (MEMS).

FIG. 9A and FIG. 9B are diagrams illustrating an example 3 of the brittle member 40. The brittle member 40, which the conductive adhesive portion 50 is disposed onto, is cut out around by a cut-out 44, and partially fixed on a bridge 43.

FIG. 10A, FIG. 10B and FIG. 10C are diagrams illustrating an example 4 of the brittle member 40. The brittle member 40, which the conductive adhesive portion 50 is disposed onto, is perforated around with many thorough holes 45. In this embodiment, ceramics, glass and silicon, and hard plastic are preferably used.

FIG. 11A, FIG. 11B and FIG. 11C are diagrams illustrating an example 5 of the brittle member 40. The brittle member 40, which the conductive adhesive portion 50 is disposed onto, is notched around by a notch 46.

The above embodiments 3 to 5 can make it easier to cause brittle fracture under the external pressing force 300, and to cause the electrodes 30 and the conductive adhesive portion 50 to be connected electrically.

<Pressing Member 70>

The switch 1 for the laminated communication device is anticipated to be smaller and smaller. As for such small switch 1 for the laminated communication device, the range where the external pressing force 300 is exerted by a finger is so wide that it is possible that a user may fail to press on a particular spot of the switch with sufficient strength with a finger.

Figure 12:
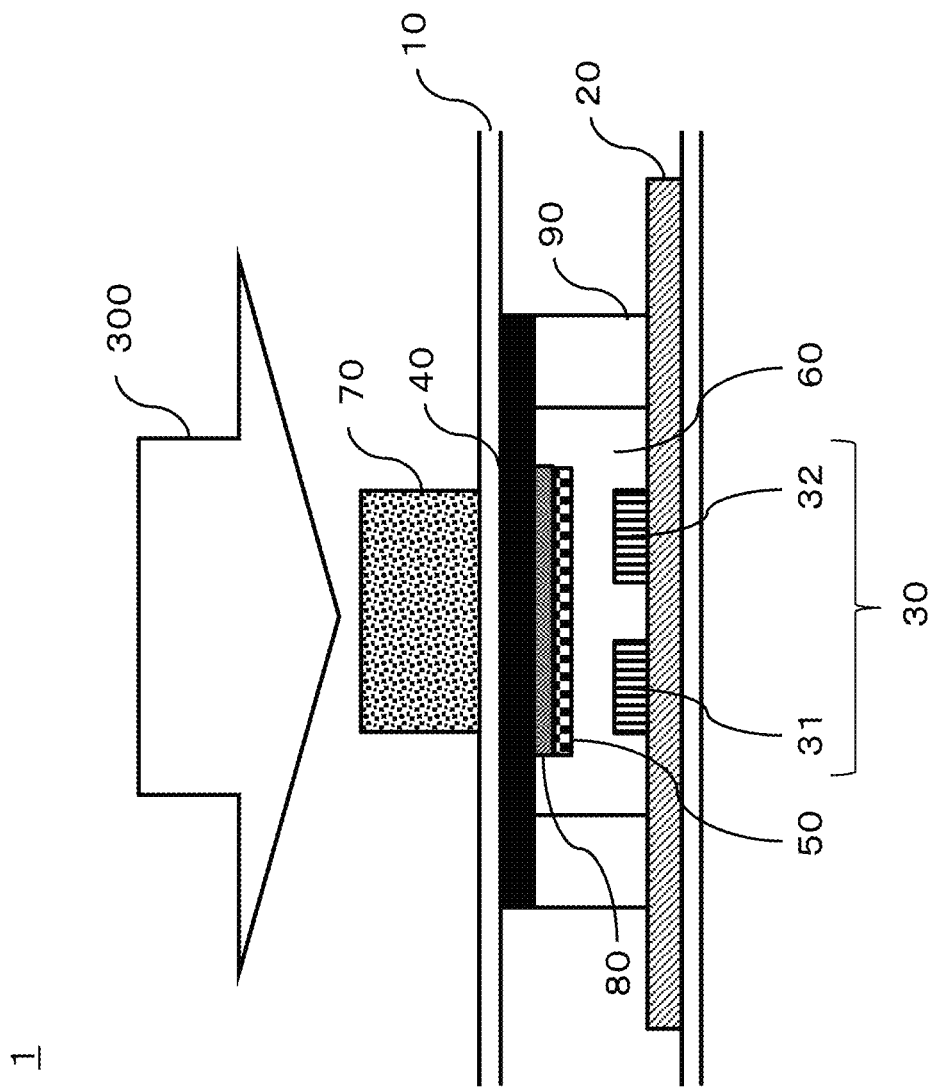
FIG. 12 is a vertical cross-sectional view illustrating the pressing member 70 in the switch (1) for the laminated communication device before pressed according to an embodiment of the present invention.

Even in such a case, the pressing member 70 may be disposed on a corresponding part to the conductive adhesive portion 50 on a laminated film 10 in order to certainly turn on the switch 1 for the laminated communication device as FIG. 12 shows. The pressing member 70 enables us to press on an appropriate spot of the switch with appropriate strength and to certainly turn it on.

The pressing member 70 may be temporarily disposed on the laminated film 10 surface, and may be removed after use.

REFERENCE SIGNS LIST

1, 6. switch for Laminated communication device
2. reversible switch
3 film battery
4. metal wiring
5. integrated circuit
10. laminated film
20. substrate
30. electrodes
31. electrode A
32. electrode B
40. brittle member
41. brittle member after brittle fracture
42. fractured portion of Brittle member
43. bridge
44. cut-out
45. thorough holes
46. notch
50. conductive adhesive portion
60. space
70. pressing member
80. metal wiring or metal film
90. spacer
100. laminated communication device
300. external pressing force

The invention claimed is:

1. A switch for a laminated communication device, comprising:
   a substrate;
   an electrode disposed on the substrate;
   a brittle member disposed so as to face the electrode and apart from the electrode; and
   a conductive adhesive portion disposed on the brittle member at a side to face the electrode thereof,
   wherein the electrode and the conductive adhesive portion are irreversibly and electrically bonded by brittle fracture of the brittle member under an external pressing force in a thickness direction of the laminated communication device.

2. The switch for the laminated communication device according to claim 1, wherein a metal wiring or a metal film is disposed between the brittle member and the conductive adhesive portion.

3. The switch for the laminated communication device according to claim 1, wherein a distance between the electrode and the conductive adhesive portion is from 0.05 to 0.1 mm.

4. The switch for the laminated communication device according to claim 2, wherein the electrode and the conductive adhesive portion and the metal wiring or the metal film are irreversibly and electrically bonded by brittle fracture of the brittle member under an external pressing force in the thickness direction of the laminated communication device.

5. The switch for the laminated communication device according to claim 1, wherein the brittle member is made of ceramic.

6. The switch for the laminated communication device according to claim 1, wherein the brittle member has at least either one of cut-out, through hole, groove and notch in a thickness direction so as to easily cause brittle fracture under an external pressing force in the thickness direction of the laminated communication device.

7. The switch for the laminated communication device according to claim 1, wherein the conductive adhesive portion is a conductive adhesive sheet.

8. The switch for the laminated communication device according to claim 1, further comprising:

a pressing member of the conductive adhesive portion disposed on a laminated film surface at an opposite side of the substrate.

9. A laminated communication device, wherein the switch for the laminated communication device according to claim 1 is used.

10. A laminated communication device, wherein both the switch for the laminated communication device according to claim 1 and a reversible push switch are used.

11. A switch for a laminated communication device, comprising:

a substrate;

an electrode disposed on the substrate;

a brittle member disposed so as to face the electrode and apart from the electrode;

a conductive adhesive portion disposed on the electrode; and a metal wiring or a metal film disposed on the brittle member at a side of the electrode thereof, wherein the electrode and the conductive adhesive portion and the metal wiring or the metal film are irreversibly and electrically bonded by brittle fracture of the brittle member under an external pressing force in a thickness direction of the laminated communication device.

12. The switch for the laminated communication device according to claim 11, wherein a distance between the metal wiring or the metal film and the conductive adhesive portion is from 0.05 to 0.1 mm.

* * * * *